United States Patent
McDiarmid et al.

(10) Patent No.: US 8,760,170 B2
(45) Date of Patent: Jun. 24, 2014

(54) FUSE CONTINUITY DETECTION

(75) Inventors: Ralph McDiarmid, Burnaby (CA);
Zoran Miletic, Burnaby (CA)

(73) Assignee: Schneider Electric Solar Inverters USA, Inc., North Billerica, MA (US)

(*) Notice: Subject to any disclaimer, the term of this patent is extended or adjusted under 35 U.S.C. 154(b) by 424 days.

(21) Appl. No.: 13/015,929

(22) Filed: Jan. 28, 2011

(65) Prior Publication Data
US 2012/0194200 A1 Aug. 2, 2012

(51) Int. Cl.
*G01R 31/08* (2006.01)
*G01R 31/02* (2006.01)
*H02H 9/00* (2006.01)
*H01G 2/12* (2006.01)
*H01H 85/30* (2006.01)
*G01R 31/327* (2006.01)
*H01H 9/16* (2006.01)
*H02J 13/00* (2006.01)
*H02H 11/00* (2006.01)

(52) U.S. Cl.
USPC ............. 324/509; 324/522; 324/550; 361/56; 361/534

(58) Field of Classification Search
CPC ....... H01H 85/30; H01H 9/16; G01R 31/327; G01R 31/02; H02J 13/00; H02H 11/00
USPC ..................... 324/509, 550, 522; 361/56, 534
See application file for complete search history.

(56) References Cited

U.S. PATENT DOCUMENTS

| | | | |
|---|---|---|---|
| 7,592,820 B2 * | 9/2009 | Laakso et al. | 324/713 |
| 7,595,644 B2 * | 9/2009 | Male | 324/509 |
| 8,294,296 B2 * | 10/2012 | Gilmore et al. | 307/45 |
| 2001/0013783 A1 * | 8/2001 | Yamashita et al. | 324/539 |
| 2006/0227472 A1 | 10/2006 | Taylor | |
| 2009/0190275 A1 | 7/2009 | Gilmore | |

FOREIGN PATENT DOCUMENTS

| | | |
|---|---|---|
| CN | 20123010196 Y | 4/2009 |
| DE | 10 2007 054 297 A1 | 5/2009 |
| GB | 2 235 982 A | 3/1991 |

OTHER PUBLICATIONS

Fischer et al., Fuse load circuit breaker for e.g. protecting consumer, has integrated resistance measuring instrument with current generator for producing test current, where instrument measures resistance of fuse; May 14, 2009; Machine Translation included.*

Fischer et al., Fuse load circuit breaker for e.g. protecting consumer, has integrated resistance measuring instrument with current generator for producing test current, where instrument measures resistance of fuse; May 14, 2009.*

International Search Report and Written Opinion; PCT/IB2012/000305; ISA/CA; May 14, 2012.

* cited by examiner

*Primary Examiner* — Melissa Koval
*Assistant Examiner* — Farhana Hoque
(74) *Attorney, Agent, or Firm* — Hunter Clark PLLC (57) ABSTRACT

Systems, methods, and circuits are disclosed for detecting continuity of a fuse or other current protection device in a circuit. For example, a signal is generated and coupled onto a closed circuit in which the continuity of the fuse closes the circuit. The signal is then coupled from the closed circuit to a signal detector, which detects the presence of the signal and provides an output indicative of the presence of the signal. If the fuse blows, the circuit is opened, prohibiting the signal from being coupled to the signal detector, in which case the signal detector provides an output indicative of the absence of the signal. This example, however, are not exhaustive.

22 Claims, 7 Drawing Sheets

FIG. 7

FUSE CONTINUITY DETECTION

BACKGROUND

Current protection devices are used ubiquitously in various modern electrical applications. A common fuse, for example, utilizes a metal wire or strip that melts when exposed to a threshold current. The melting of the metal breaks the continuity of the fuse, which interrupts the circuit in which the fuse is connected. This interruption prevents further damage to electrical components and other structures from overheating and fire.

The use of current protection devices in power electronics applications is especially important, due to the higher susceptibility of overheating parts from exposure to higher currents. Because of this increased risk, regulations oven require current protection. For instance, photovoltaic energy conversion systems for residential, commercial, and industrial applications, must be equipped to detect and interrupt the unintended flow of DC current to ground, known as a ground fault. Detecting whether a fuse has blown in such situations can include measuring a voltage across the fuse. However, voltage measurements across a fuse can be unreliable because voltage can vary with temperature, fuse type, and the nature of a ground fault on a grounded conductor.

SUMMARY

An example of a circuit for determining the continuity of a fuse according to the disclosure includes a fuse, a first galvanic isolator, and a second galvanic isolator communicatively coupled in series with the first galvanic isolator and the fuse as part of a closed circuit. The circuit further includes a signal-generation unit, communicatively coupled to the first galvanic isolator, configured to generate an electrical signal and provide the electrical signal to the closed circuit by generating a current in the closed circuit via the first galvanic isolator. Finally, the circuit includes as signal-detection unit, communicatively coupled to the second galvanic isolator, configured to determine whether the electrical signal is present in the closed circuit. The signal-detection unit is configured to provide an output signal based, at least in part, on whether the electrical signal is present in the closed circuit.

Implementations of such a circuit may include one or more of the following features. The electrical signal is an oscillating signal. The oscillating signal is a sine wave. The oscillating signal has a frequency between 5 kHz and 150 kHz. The signal-detection unit includes a comparator configured to decrease a voltage of the output signal when the electrical signal is detected. A voltage bias circuit to provide a bias voltage to an input of the comparator. The signal-detection unit includes a comparator configured to increase a voltage of the output signal if the electrical signal is detected. A photovoltaic array, where the fuse is electrically coupled to a positive terminal of the photovoltaic array or a negative terminal of the photovoltaic array. The first galvanic isolator and the second galvanic isolator each comprise a transformer. One or both of the transformers are configured to alter an amplitude of the electrical signal such that the amplitude of the electrical signal when generated is different than the amplitude of the electrical signal when detected.

An example of a method for determining the continuity of a fuse in an electrical circuit according to the disclosure includes generating an electrical signal and providing the electrical signal to a closed circuit where the closed circuit is closed by the continuity of the fuse and the electrical signal is provided to the closed circuit by using a first galvanic isolator to generate a current in the closed circuit. The method also includes detecting, using a second galvanic isolator, whether the electrical signal is present in the closed circuit, and providing an output signal based, at least in part, on the detection of the electrical signal.

Implementations of such a method may include one or more of the following features. Generating the electrical signal comprises generating an oscillating signal. Generating the oscillating signal comprises generating a sine wave. Generating the oscillating signal comprises generating the oscillating signal to have a frequency between 5 kHz and 150 kHz. Removing a frequency from the output signal related to the oscillating signal. Providing an output signal includes decreasing a voltage of the output signal when the electrical signal is detected in the closed circuit. Detecting whether the electrical signal is present in the closed circuit includes using a rectifier to rectify a second electrical signal.

An example of a photovoltaic array with ground fault detection according to the disclosure includes a terminal configured to provide a positive voltage or a negative voltage of the photovoltaic array, a fuse communicatively coupled between the terminal and an electrical ground, and a first transformer. The photovoltaic array also includes a second transformer communicatively coupled in series with the first transformer and the fuse as part of a closed circuit. Additionally, the photovoltaic array includes a signal-generation circuit, communicatively coupled to the first transformer, configured to generate an electrical signal and provide the electrical signal to the closed circuit by generating a current in the closed circuit via the first transformer. Finally the photovoltaic array includes a signal-detection circuit, communicatively coupled to the second transformer, configured to determine whether the electrical signal is present in the closed circuit. The signal-detection unit is configured to provide an output signal based, at least in part, on whether the electrical signal is present in the closed circuit.

Implementations of such a photovoltaic array may include one or more of the following features. The electrical signal comprises an oscillating signal with a frequency between 5 kHz and 150 kHz. The oscillating signal is a sine wave. The signal-detection circuit includes a comparator configured to decrease a voltage of the output signal if the electrical signal is detected. The signal-detection unit includes a comparator configured to increase a voltage of the output signal if the electrical signal is detected.

Items and/or techniques described herein may provide one or more of the following capabilities, as well as other capabilities not mentioned. Fuse continuity can be detected without a potentially unreliable voltage measurement across the fuse. In applications where a fuse is used to prevent a ground fault, ground fault detection can be automatic, e.g., based on the determination of fuse continuity. Implementations described herein can be cost effective and simple in design. While item/technique-effect pairs have been described, it may be possible for a noted effect to be achieved by means other than those noted, and a noted item/technique may not necessarily yield the noted effect.

DETAILED DESCRIPTION

Techniques are discussed for detecting continuity of a fuse or other current protection device in a circuit. For example, a signal is generated and provided to a closed circuit in which the continuity of the fuse closes the circuit. The signal is provided from the closed circuit to a signal detector, which detects the presence of the signal and provides an output indicative of the presence of the signal. If the fuse blows, the circuit is opened, prohibiting the signal from being coupled to the signal detector, in which case the signal detector provides an output indicative of the absence of the signal. This example, however, is not exhaustive.

Fuses are commonly found in ground-fault protection circuits in electrical systems, such as photovoltaic (PV) systems, with positive or negative terminals connected to an external (e.g. chassis) ground. A ground fault in a grounded rooftop PV array, for example, can be caused by an unintended connection to (i.e., a diversion of current onto) a conductive building fixture such as metal eaves trough, roof gutter, soffit, or aluminum siding. Current flowing in any of these fixtures can be large enough to cause over-heating of nearby combustible materials, and temperatures may be high enough to cause ignition. Some roof fires have been attributed to PV ground faults.

To prevent fires and other hazards, ground-fault detection and protection is now required for all PV installations. The international, non-profit advocate for fire, electrical, and building safety, National Fire Protection Association (NFPA), has published about 300 advisory codes. Among these codes is NFPA 70, also known as the National Electrical Code (NEC). NEC article 690.5 states that all grounded direct current (DC) PV arrays be provided with ground-fault protection. The ground-fault protection device needs to detect a ground-fault current, interrupt the fault current (a certified fuse can be used for this purpose), and provide an indication of the ground fault.

Figure 1A:
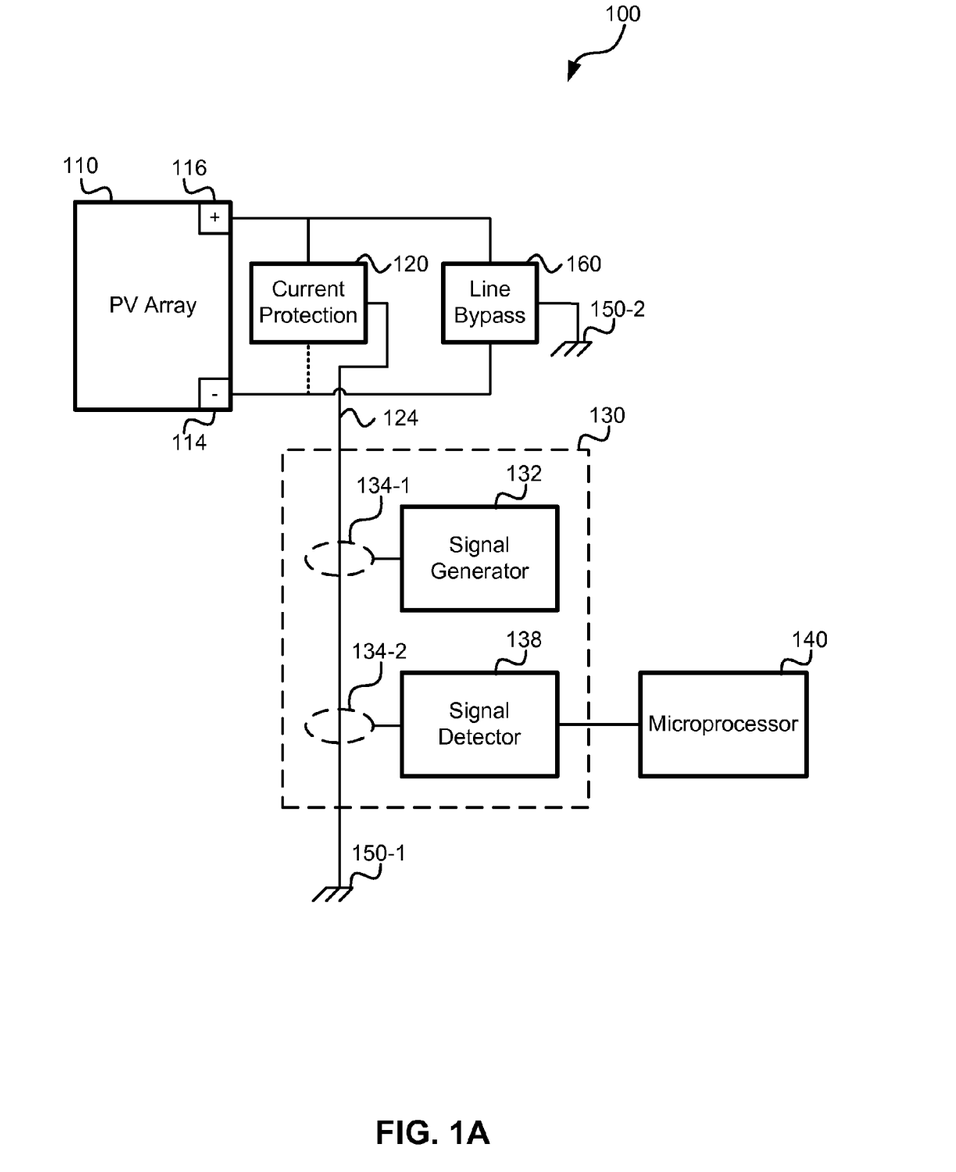
FIG. 1A is a block diagram of a photovoltaic (PV) system with circuitry to detect the continuity of the PV system's current protection.

FIG. 1A is a block diagram illustrating a general configuration of a photovoltaic system 100 having a PV array 110 electrically coupled to ground-fault protection circuitry 120, 130, 160. The PV array 110 has a positive terminal 116 and a negative terminal 114, one of which is connected, through a current protection circuit 120, to ground 150. For example, if the positive terminal 116 is connected through the current protection circuit 120, the PV system 100 is a positive-grounded system. Likewise, if the negative terminal 114 is connected through the current protection circuit 120, the PV system 100 is a negative-grounded system. The ground 150 is an electrical connection with a chassis or other electrically-neutral component of an object or structure to which the PV system 100 is attached. If a ground fault occurs, the current protection circuit 120 breaks the continuity of the connection from the PV array 110 (i.e., the positive terminal 116 or the negative terminal 114, whichever is connected) to ground, thereby helping provide protection against potential damage that could occur due to the ground fault. Current protection 120 typically can comprise a traditional "one-shot" fuse, although other components can be used, such as a resettable fuse, circuit breaker, and/or any other device designed to break electrical continuity when exposed to excessive current flow.

Figure 1B:
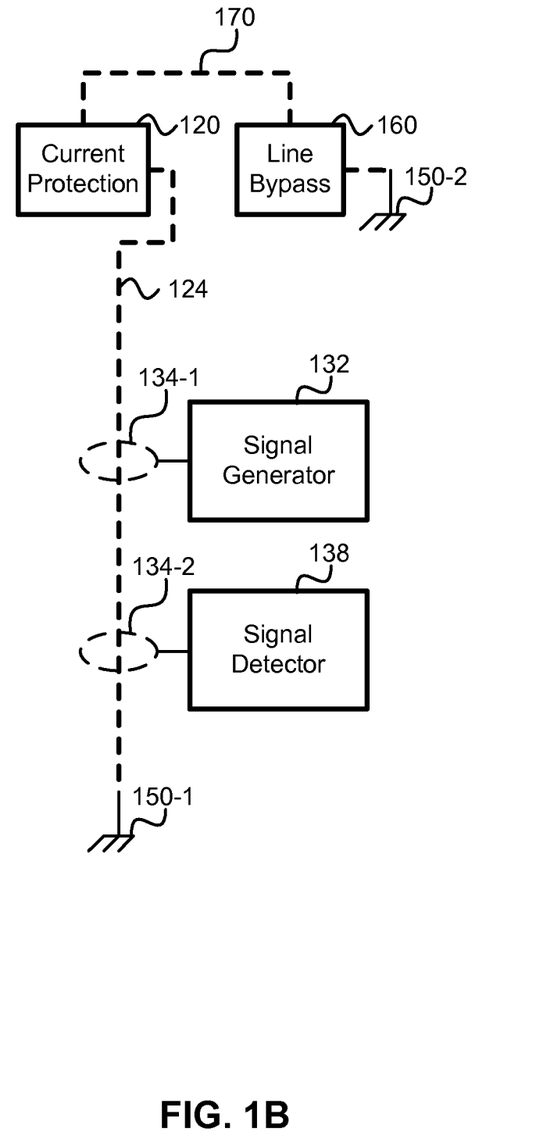
FIG. 1B is a block diagram of components of the PV system of FIG. 1A forming a closed circuit due to the continuity of the PV system's current protection.

The current protection circuitry 120 forms part of a closed circuit. Referring to FIG. 1B, the components related to a circuit in the PV system of FIG. 1A that is closed due to the continuity of the PV system's current protection, are shown. Specifically, the current protection circuit 120 forms a closed circuit by enabling current to flow from a first ground 150-1 through a signal-injection node 124, the current protection circuit 120, and line bypass circuitry 160 back to ground 150-2. The current path is indicated in FIG. 1B by dashed line 170. Thus, if the continuity of the current protection circuit 120 is broken, it opens the circuit.

Referring again to FIG. 1A, the continuity of the current protection circuit 120 is detected with the detection circuitry 130. The detection circuitry 130 comprises a signal generator 132 electrically coupled to a first galvanic isolator 134-1, which is also electrically coupled with the signal-injection node 124 of the closed circuit. This enables the first galvanic isolator 134-1 to couple a signal generated by the signal generator 132 to the closed circuit.

Functional considerations may impact how the galvanic isolators 134 are implemented. For example, although galvanic isolator 134-1 and/or the second galvanic isolator 134-2 (discussed below) are typically transformers, other devices, such as optocouplers, can provide galvanic isolation, although some alterations in the circuitry may be needed. Moreover, although the configuration of FIG. 1A illustrates the galvanic isolators 134 electrically coupled to the closed circuit at the signal-injection node 124, one or both of the galvanic isolators 134 can be electrically coupled at any location of the closed circuit. Furthermore, the signal may be altered (e.g., changed in waveform, amplitude, etc.), based on the components of the closed circuit and/or the galvanic isolators 134. For example, for galvanic isolators 134 comprising transformers, the windings on the transformers may be configured to alter the amplitude of the signal, such that the amplitude of the signal, when generated, is not equal to the amplitude of the signal when detected.

The signal generator 132 can generate one or more of a variety of signals, depending on desired functionality. For instance, the signal can be discrete or continuous, bearing in mind the frequency and amplitude limitations of the components of the closed circuit (e.g., the line bypass circuit 160 and galvanic isolators 134). Oscillating signals such as a sine wave, square wave, sawtooth, etc. can be used, although a sine wave is preferable in configurations where radio frequency (RF) emissions or other interference caused by harmonics could raise issues with the performance and/or emissions compliance of the photovoltaic system 100.

The detection circuitry 130 also includes a signal detector 138 configured to detect the signal created by the signal generator 132 and coupled onto the closed circuit. Similar to the signal generator 132, the signal detector 138 is electrically coupled to a second galvanic isolator 134-2, which couples the signal from the closed circuit to the signal detector 138. If, however, the continuity of the current protection circuit 120 is broken, thereby opening the closed circuit, then the signal generated by the signal generator 132 cannot be coupled to the open circuit and the signal detector 138. The signal detector 138 detects the presence or absence of the signal and generates a corresponding output, indicative of the presence or absence of the signal. This output is provided to a microprocessor 140, which performs one or more actions, such as indicate the condition of the current protection circuit 120 using a display (not shown), light-emitting diode (not shown), and/or electronic message. In alternative configurations, the signal detector's output can be provided to circuitry other than a microprocessor. For instance, the output can drive an LED and/or other indicator directly.

Figure 2:
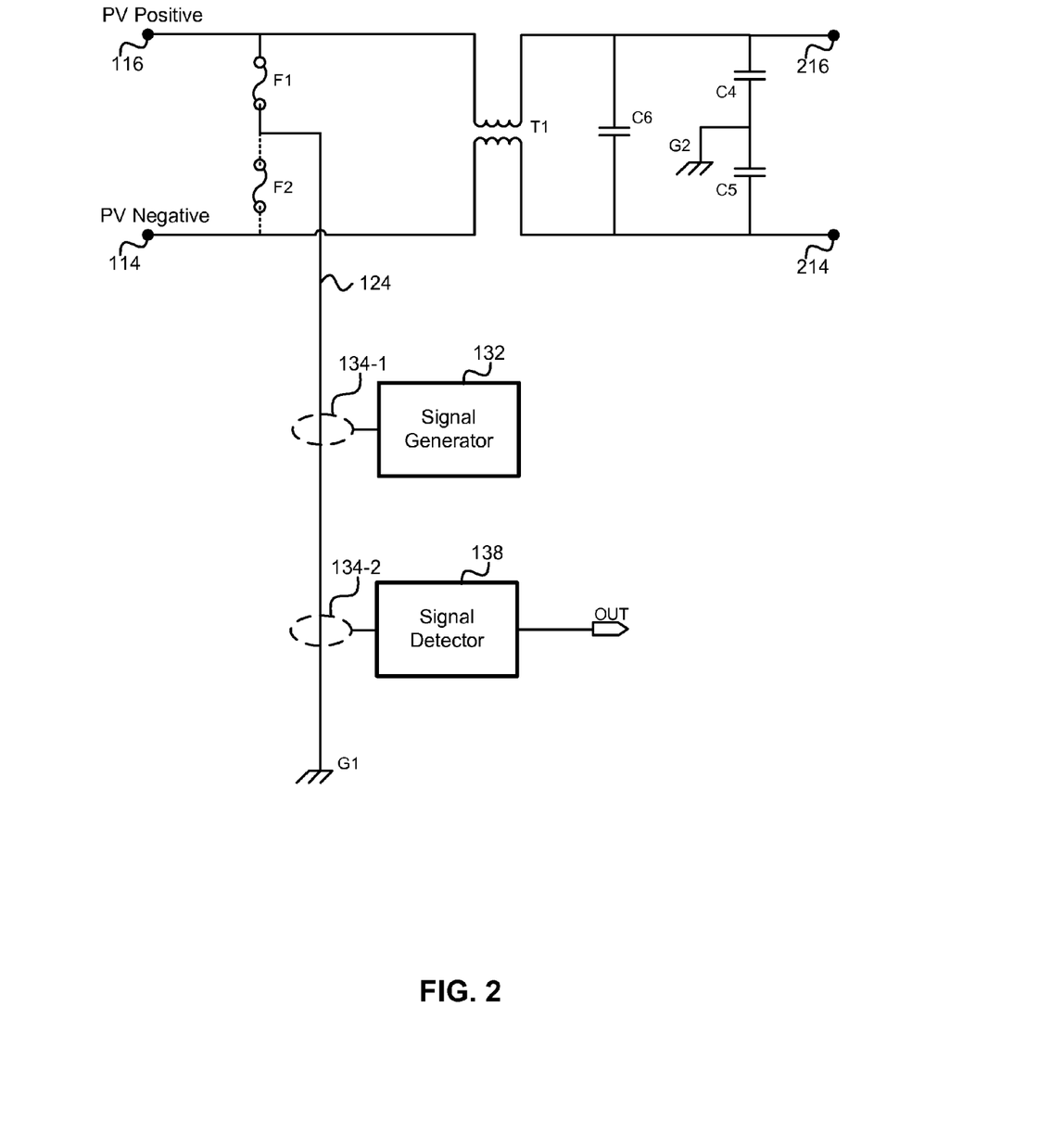
FIG. 2 is a schematic diagram of the electrical components of current protection and line bypass elements of FIGS. 1A and 1B.

FIG. 2 is a schematic diagram illustrating the electrical components of some of the blocks of FIG. 1. As illustrated, the positive terminal 116 of a PV array is connected through fuse F1 to a first chassis ground G1. Alternatively, fuse F2 can be used instead of F1, connecting the negative terminal 114 to ground. Components T1, C4, C5, C6, and G2 illustrate additional circuitry that can be electrically coupled with the PV terminals 114, 116. In particular, components C4 and C5 provide a path of AC current (as discussed below), and T1 and C6 are parts of electromagnetic interference (EMI) filter. T1 and C6 are not essential for the detection circuitry 130 to work and may be omitted in alternative configurations. Electrical connections 214, 216 can be used to power other components (not shown). Such components can include a Wheatstone bridge that also can be used to help detect a ground fault in the PV system 100.

Importantly, the components shown in FIG. 2 close the circuit to which the signal from the signal generator 132 is coupled. For example, not only does fuse F1 or F2 provide continuity in the closed circuit, but y-capacitors C4 and C5 complete the closed circuit for alternating current. This enables signal current to flow from the first chassis ground G1 to a second chassis ground G2 when a fuse F1 or F2 is continuous. Alternative configurations can include components, other than y-capacitors C4 and C5, to complete the closed circuit for the signal current.

Figure 3:
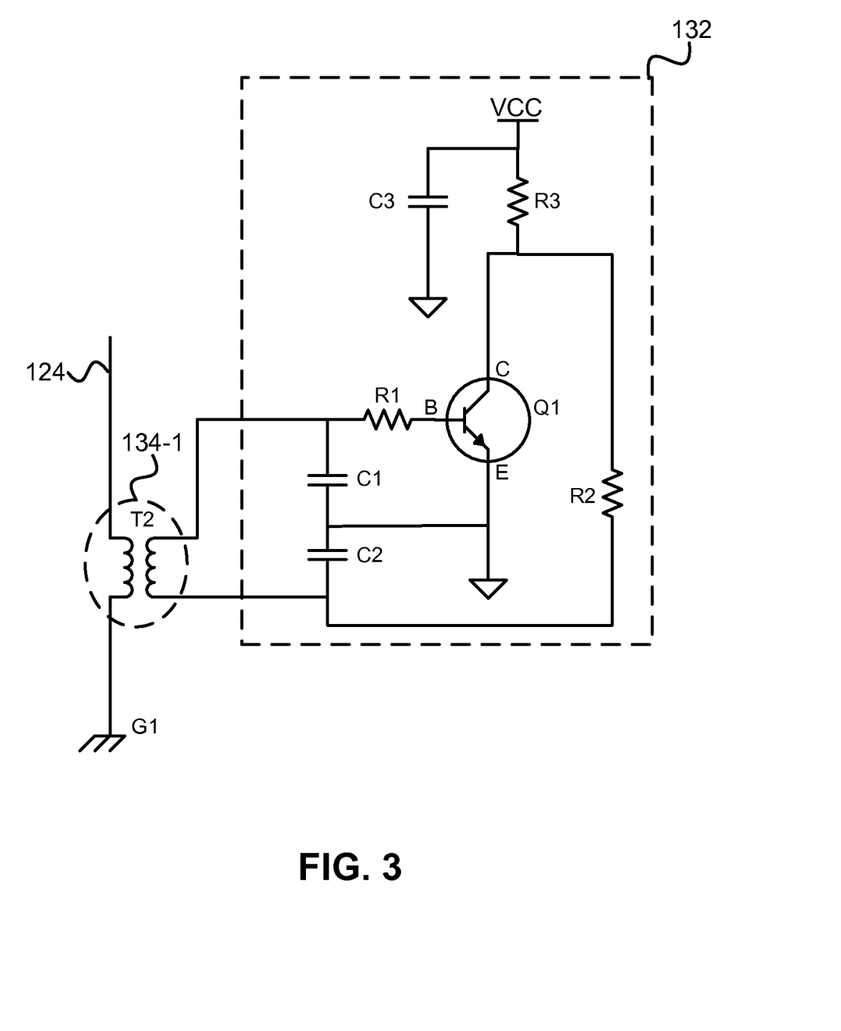
FIG. 3 is a schematic diagram of a signal generator and an associated galvanic isolator shown in FIGS. 1A,1B, and 2.

FIG. 3 is a schematic diagram of the portion of the PV system 100 of FIGS. 1A and 1B relating to generating the signal and coupling it to the closed circuit at the signal-injection node 124. In this configuration, the signal generator 132 is a simple sine-wave generator, where values for C1, C2, C3, R1, R2, R3, B, and VCC are selected to determine the amplitude and frequency of the sine wave, which is coupled to the closed circuit at the signal-injection node 124 using transformer T2.

Frequencies of the sine wave can vary, depending on desired functionality and manufacturing concerns. Configurations can provide frequencies generally ranging from 50 kHz to 100 kHz, although frequencies as high as 150 kHz and as low as 5 kHz are contemplated. Moreover, frequencies higher than 150 kHz or lower than 5 kHz can be used, but can be problematic in certain circumstances. For example, frequencies higher than 150 kHz may require additional measures to be taken for emissions compliance. Frequencies lower than 5 kHz, on the other hand, may require bulky components that may be limiting due to cost and/or size.

Figure 4:
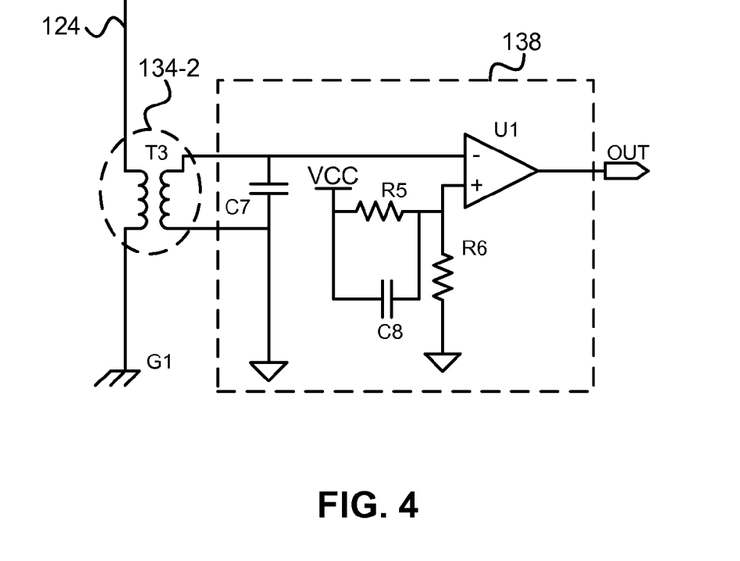
FIG. 4 is a schematic diagram of a signal detector and an associated galvanic isolator shown in FIGS. 1A,1B, and 2.

FIG. 4 is a schematic illustrating the electrical components of the second galvanic isolator 134-2 and the signal detector 138, according to one configuration. Galvanic isolation between the closed circuit and the signal detector 138 is provided by a transformer T3, which couples the signal on the closed circuit to the signal detector 138. In the configuration of FIG. 4, the signal is provided to an inverting input of a comparator U1. This comparator U1 performs a "precision rectifier" action on the signal and produces a pulse train at its open-collector output OUT. Resistors R5 and R6 are chosen to bias the voltage at the non-inverting input of the comparator U1 such that the output OUT, when it is passed through a time-constant low-pass filter 500 of FIG. 5, a resulting average DC voltage at the output FUSE OPEN remains near 0V. For example, the configuration shown in FIGS. 4 and 5 can be enabled to provide a digital low at the output FUSE OPEN when a 50 kHz, 250 mV peak sine wave is provided at the inverting input of the comparator U1. Other configurations can include various alterations, such as reversing the inputs on the comparator U1 to invert the corresponding output if a signal is detected. Additionally or alternatively, the bias voltage set by the resistors R5 and R6 can be altered to adjust the sensitivity of the comparator U1 to the signal.

Figure 5:
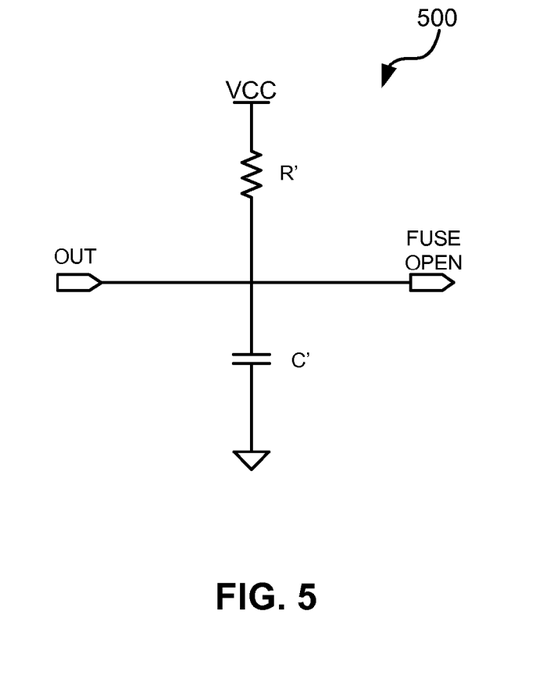
FIG. 5 is a simplified schematic diagram of a low-pass filter circuit.

Referring to FIG. 5, resistor R' and capacitor C' of the time-constant low-pass filter 500 can be chosen such that a signal, greater than a certain threshold voltage, at the inverting input of the comparator U1 keeps the output FUSE OPEN to a digital low, while the absence of a signal at the inverting input of the comparator U1 drives the output FUSE OPEN to a digital high. For example, the configuration shown in FIGS. 4 and 5 can be enabled such that a sine wave signal of less than 80 mV at the inverting input of the comparator U1 enables the capacitor C' to charge, driving the output FUSE OPEN to a digital high. On the other hand, a sine wave signal greater than 80 mV at the inverting input of the comparator U1 turns on an output transistor (not shown) of the comparator U1 and quickly discharges C', driving the output FUSE OPEN to a digital low.

In sum, referring to the configuration shown in FIGS. 2-5, when a fuse F1 or F2 is continuous (e.g., not blown), a sine wave signal generated by the signal generator 132 is injected onto the closed circuit at the signal-injection node 124 by the secondary winding of transformer T2. Current in the closed circuit, corresponding to the signal, flows through the fuse F1 or F2, the chassis, the y-capacitor C4 or C5, and is returned through the primary winding of transformer T3. The current in the primary winding of transformer T3 is coupled to the secondary winding of transformer T3 to produce a small sinusoid signal at the inverting input of the comparator U1. The voltage comparator U1 rectifies the input and produces a pulse train at its output OUT, discharging the capacitor C' of the time-constant low-pass filter 400, and providing a logic low at the output FUSE OPEN. If no signal is detected at U1, the output of U1 is a positive voltage that allows capacitor C' to charge, driving the output FUSE OPEN to a logic high.

Figure 6:
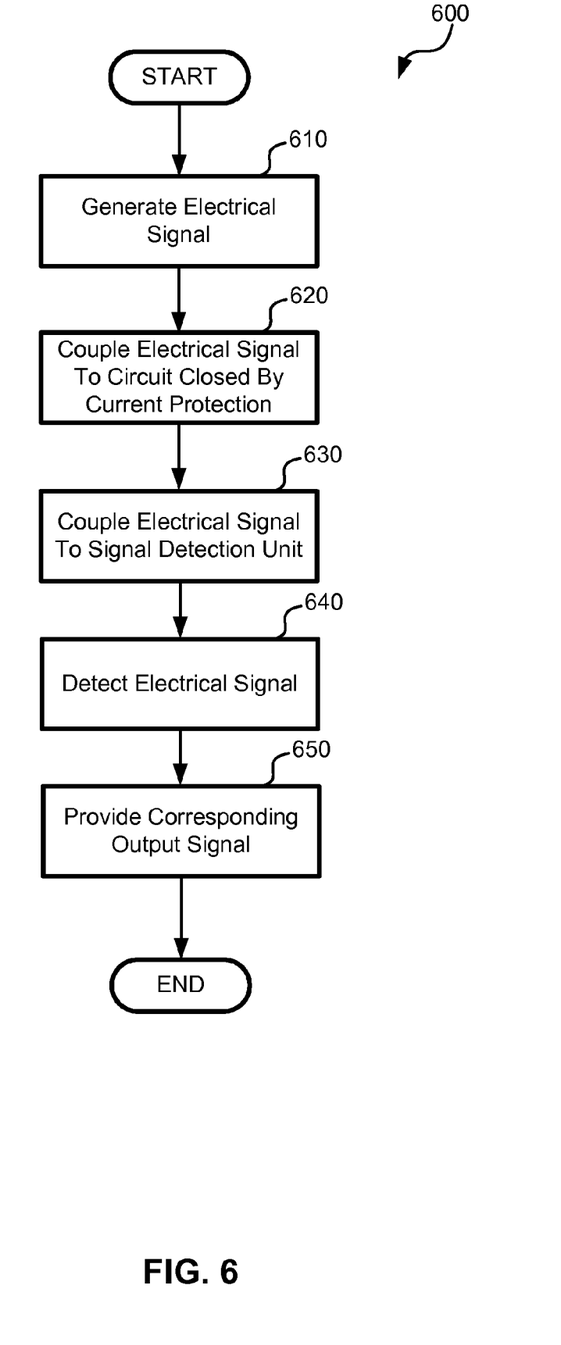
FIG. 6 is a flow diagram of a process for determining the continuity of a current protection circuit.

Referring to FIG. 6, with further reference to FIGS. 1-5, a process 600 of determining the continuity of a current protection circuit 120 is shown. The process 600 is, however, an example only and not limiting. The process 600 can be altered, e.g., by having stages added, removed, rearranged, combined, and/or performed concurrently.

At stage 610, an electrical signal is generated, and at stage 620, the electrical signal is coupled to circuit closed by a current protection circuit 120, such as a fuse F1, F2. As disclosed herein, the electrical signal can be any of a variety of signals capable of being coupled to and from a closed circuit. Moreover the signal may be altered (e.g., changed in waveform, amplitude, etc.), based on the components of the closed circuit and/or the galvanic isolators 134.

At stage 630 the electrical signal is coupled to a signal detection unit, and at stage 640, the electrical signal is detected. The signal detection unit can comprise the signal detector 138 of FIG. 4 or another circuit similarly capable of detecting the electrical signal and altering an output response accordingly. At stage 650, the corresponding output signal is provided. The output signal can be any of a variety of signal types (e.g., discrete, continuous, analog, digital, etc.), depending on desired functionality.

Figure 7:
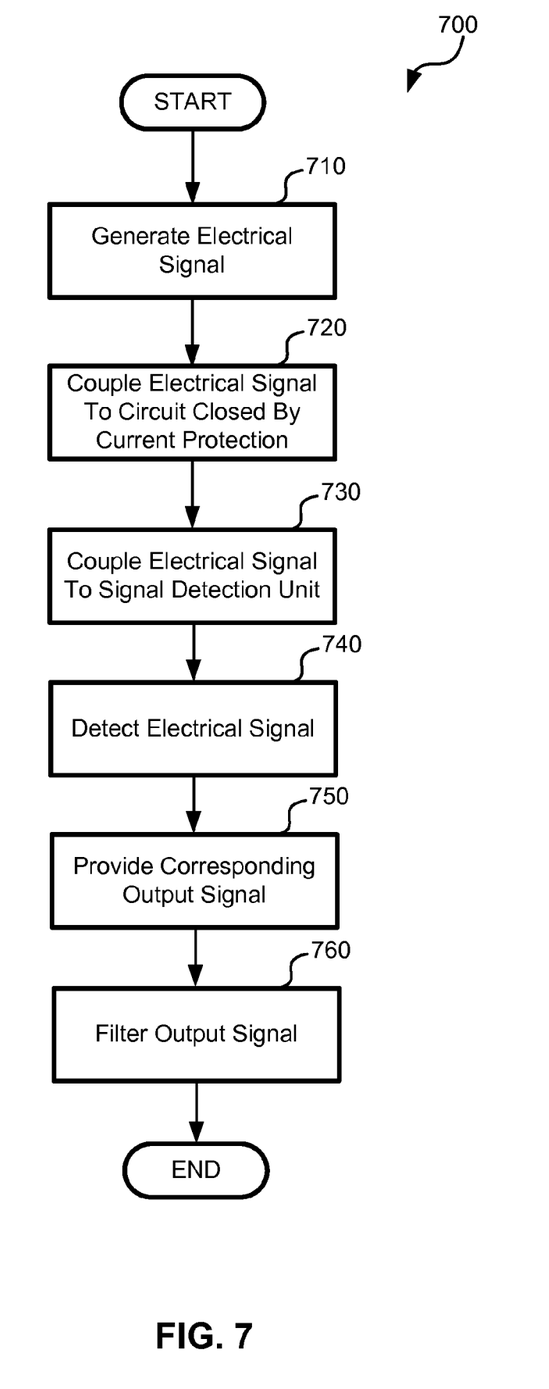
FIG. 7 is a flow diagram of another process for determining the continuity of a current protection circuit.

FIG. 7 is a flow diagram of another process 700 of determining the continuity of a current protection circuit 120 is shown. The stages of process 700 are similar to the process 600 of FIG. 6. Process 700, however, has an additional stage 760, which includes filtering an output signal. This filtering can provide, for example, a filtered output representing a digital high or low. Such a filtered output can provide a suitable interface to a digital circuit, such as a microprocessor, digital signal processor (DSP), or similar circuit.

The methods, systems, and devices discussed above are examples and not limiting. Various configurations may omit, substitute, or add various procedures or components as appropriate. For instance, features described with respect to certain configurations may be combined in various other configurations. For example, the time-constant low-pass filter 500 of FIG. 5 and/or other filtering components can be included in the signal detector 138 of FIG. 4. Additional components, such as those used for reduction of RF interference can be incorporated into the configurations described herein with no affect on circuit operation. Moreover, although configurations described herein are in the context of PV systems, the methods, systems, and devices discussed above applications apply in other contexts where fuses and/or other current protection devices are used.

Specific details are given in the description to provide a thorough understanding of example configurations and implementations. Other examples may or may not use these specific details. For example, well-known circuits, processes, algorithms, structures, and techniques have been shown without unnecessary detail in order to avoid obscuring the description.

Operations described above in a sequential process may be performed in a different sequence, and operations can be omitted or added to the processes described, and/or may be performed concurrently. Furthermore, processes described above may be implemented by hardware, software executed by a processor, firmware, middleware, microcode, hardware description languages, or any combination thereof. When implemented in software, firmware, middleware, or microcode, the program code or code segments to perform the operations may be stored in a non-transitory computer-readable medium such as a storage medium. One or more processors can execute the software to perform the appropriate tasks.

Various modifications, alternative constructions, and equivalents may be used without departing from the spirit of the disclosure. For example, elements described above may be components of a larger system, where other rules may take precedence over or otherwise modify the description. Also, a number of steps may be undertaken before, during, or after the above elements are considered. Accordingly, the above description is not limiting of the disclosure and does not define the bounds of the claims.

Other examples and implementations are within the scope and spirit of the disclosure and appended claims. Features implementing functions may be physically located at various positions, including being distributed such that portions of functions are implemented at different physical locations.

Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C).

Further, more than one invention may be disclosed.

What is claimed is:

1. A system for determining the continuity of a fuse, the system comprising:
   a fuse;
   a first galvanic isolator;
   a second galvanic isolator communicatively coupled in series with the first galvanic isolator and the fuse as part of a circuit;
   a signal-generation unit, communicatively coupled to the first galvanic isolator, configured to generate an electrical signal and to provide the electrical signal to the circuit by generating a current in the circuit via the first galvanic isolator only when the fuse is continuous; and
   a signal-detection unit, communicatively coupled to the second galvanic isolator, configured to determine whether the electrical signal is present in the circuit, wherein the signal-detection unit is configured to provide an output signal based, at least in part, on whether the electrical signal is present in the circuit.

2. The system for determining the continuity of the fuse as recited in claim 1, wherein the electrical signal is an oscillating signal.

3. The system for determining the continuity of the fuse as recited in claim 2, wherein the oscillating signal is a sine wave.

4. The system for determining the continuity of the fuse as recited in claim 2, wherein the oscillating signal has a frequency between 5 kHz and 150 kHz.

5. The system for determining the continuity of the fuse as recited in claim 1, wherein the signal-detection unit includes a comparator configured to decrease a voltage of the output signal when the electrical signal is detected.

6. The system for determining the continuity of the fuse as recited in claim 1, further including a voltage bias circuit to provide a bias voltage to an input of the comparator.

7. The system for determining the continuity of the fuse as recited in claim 1, wherein the signal-detection unit includes a comparator configured to increase a voltage of the output signal if the electrical signal is detected.

8. The system for determining the continuity of the fuse as recited in claim 1, further comprising a photovoltaic array, wherein the fuse is electrically coupled to a positive terminal of the photovoltaic array or a negative terminal of the photovoltaic array.

9. The system for determining the continuity of the fuse as recited in claim 1, wherein the first galvanic isolator and the second galvanic isolator each comprise a transformer.

10. The system for determining the continuity of the fuse as recited in claim 9, wherein one or both of the transformers are configured to alter an amplitude of the electrical signal such that the amplitude of the electrical signal when generated is different than the amplitude of the electrical signal when detected.

11. A method for determining the continuity of a fuse in an electrical circuit, the method comprising:
   generating an electrical signal;
   providing the electrical signal to the electrical circuit, wherein:
      the electrical circuit is closed by continuity of the fuse, and
      the electrical signal is provided to the electrical circuit by using a first galvanic isolator to generate a current in the electrical circuit only when the fuse is continuous, and
   detecting, using a second galvanic isolator, whether the electrical signal is present in the electrical circuit; and providing an output signal based, at least in part, on the detection of the electrical signal.

12. The method for determining the continuity of the fuse in the electrical circuit as recited in claim 11, wherein generating the electrical signal comprises generating an oscillating signal.

13. The method for determining the continuity of the fuse in the electrical circuit as recited in claim 12, wherein generating the oscillating signal comprises generating a sine wave.

14. The method for determining the continuity of the fuse in the electrical circuit as recited in claim 12, wherein generating the oscillating signal comprises generating the oscillating signal to have a frequency between 5 kHz and 150 kHz.

15. The method for determining the continuity of the fuse in the electrical circuit as recited in claim 12, further comprising removing a frequency from the output signal related to the oscillating signal.

16. The method for determining the continuity of the fuse in the electrical circuit as recited in claim 11, wherein providing an output signal includes decreasing a voltage of the output signal when the electrical signal is detected in the electrical circuit.

17. The method for determining the continuity of the fuse in the electrical circuit as recited in claim 11, wherein detecting whether the electrical signal is present in the electrical circuit includes using a rectifier to rectify a second electrical signal.

18. A photovoltaic array with ground fault detection, the photovoltaic array comprising:
a terminal configured to provide a positive voltage or a negative voltage of the photovoltaic array;
a fuse communicatively coupled between the terminal and an electrical ground;
a first transformer;
a second transformer, wherein the second transformer is communicatively coupled in series with the first transformer and the fuse as part of a circuit;
a signal-generation circuit, communicatively coupled to the first transformer, configured to generate an electrical signal and provide the electrical signal to the circuit by generating a current in the circuit via the first transformer; and
a signal-detection circuit, communicatively coupled to the second transformer, configured to determine whether the electrical signal is present in the circuit, wherein the signal-detection unit is configured to provide an output signal based, at least in part, on whether the electrical signal is present in the circuit.

19. The photovoltaic array with ground fault detection as recited in claim 18, wherein the electrical signal comprises an oscillating signal with a frequency between 5 kHz and 150 kHz.

20. The photovoltaic array with ground fault detection as recited in claim 19, wherein the oscillating signal is a sine wave.

21. The photovoltaic array with ground fault detection as recited in claim 18, wherein the signal-detection circuit includes a comparator configured to decrease a voltage of the output signal if the electrical signal is detected.

22. The photovoltaic array with ground fault detection as recited in claim 18, wherein the signal-detection unit includes a comparator configured to increase a voltage of the output signal if the electrical signal is detected.

* * * * *